(12) United States Patent
Okumura

(10) Patent No.: US 11,508,874 B2
(45) Date of Patent: Nov. 22, 2022

(54) LIGHT EMITTING APPARATUS AND PROJECTOR

(71) Applicant: SEIKO EPSON CORPORATION, Tokyo (JP)

(72) Inventor: Osamu Okumura, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 182 days.

(21) Appl. No.: 17/105,921

(22) Filed: Nov. 27, 2020

(65) Prior Publication Data

US 2021/0167247 A1 Jun. 3, 2021

(30) Foreign Application Priority Data

Nov. 28, 2019 (JP) .............................. JP2019-215065

(51) Int. Cl.
*H01L 33/00* (2010.01)
*H01L 33/18* (2010.01)
(Continued)

(52) U.S. Cl.
CPC .......... *H01L 33/18* (2013.01); *G03B 21/2033* (2013.01); *H01L 33/60* (2013.01); *H01L 33/64* (2013.01); *H04N 9/3155* (2013.01)

(58) Field of Classification Search
CPC ......... H01L 33/18; H01L 33/60; H01L 33/64; G03B 21/2033
See application file for complete search history.

(56) References Cited

U.S. PATENT DOCUMENTS

2011/0169025 A1 7/2011 Kishino et al.
2016/0254138 A1* 9/2016 Kikuchi .............. H01L 21/0254
438/507
(Continued)

FOREIGN PATENT DOCUMENTS

JP 2009-009978 A 1/2009
JP 2019040982 A * 3/2019 ............. C23C 14/06
(Continued)

OTHER PUBLICATIONS

Kazuhide Kusakabe et al 2001 Jpn. J. Appl. Phys. 40 L192 (Year: 2001).*

*Primary Examiner* — Gerald J Sufleta, III
(74) *Attorney, Agent, or Firm* — Oliff PLC

(57) ABSTRACT

A light emitting apparatus including a substrate, a first and a second light emitter, a first mirror that reflects light from first light emitter, a second mirror that reflects light from second light emitter, and a support member that has a first and second hole and supports the first and second mirror. The first and second light emitter each include a first semiconductor layer, a second semiconductor layer having conductivity type different from the conductivity type of first semiconductor layer, and a light emitting layer provided between the first and second semiconductor layer. The first semiconductor layer forms a plurality of columnar sections. The plurality of columnar sections of the first light emitter and the second light emitter are disposed in the first and second hole respectively. The first mirror and second mirror are provided at the side surface of support member that defines the first and second hole respectively.

7 Claims, 10 Drawing Sheets

(51) Int. Cl.
   *G03B 21/20*   (2006.01)
   *H01L 33/64*   (2010.01)
   *H01L 33/60*   (2010.01)
   *H04N 9/31*    (2006.01)

(56) References Cited

U.S. PATENT DOCUMENTS

2017/0117438 A1*  4/2017  Shur .................... H01L 33/405
2017/0358712 A1* 12/2017  Kashima ................ H01L 33/22
2018/0090058 A1   3/2018  Chen et al.
2018/0132330 A1   5/2018  Chong et al.

FOREIGN PATENT DOCUMENTS

JP      2019054127 A  *  4/2019  ............. G03B 21/00
JP      2019149503 A  *  9/2019  ......... G03B 21/2033
WO      2010/023921 A1    3/2010
WO      2016/113935 A1    7/2016

* cited by examiner

LIGHT EMITTING APPARATUS AND PROJECTOR

The present application is based on, and claims priority from JP Application Serial Number 2019-215065, filed Nov. 28, 2019, the disclosure of which is hereby incorporated by reference herein in its entirety.

BACKGROUND

1. Technical Field

The present disclosure relates to a light emitting apparatus and a projector.

2. Related Art

In recent years, particularly in a digital signage market and an education market, there is an increasing need for projection on a large screen under a brighter environment, and further higher luminance is therefore required. Further, a mercury lamp widely having been used as the light source of a projector has a problem of the life, that is, the lamp gradually dims down and abruptly goes out, and an environmental problem on mercury regulation. The light source of a projector is therefore being changed to a solid-state light source that emits high-luminance light, lasts for a long period, and is free of mercury, such as an LED (light emitting diode).

For example, JP-A-2009-9978 describes an illuminator in which a nano-column light emitting diode (LED) is implemented in a ceramic package and the light emitted from the nano-column light emitting diode is reflected off an Al thin film formed on a wall surface of a recess of the ceramic package.

The illuminator described in JP-A-2009-9978 includes one nano-column light emitting diode, and a plurality of nano-column light emitting diodes can be arranged for an increase in the luminance of the light from the illuminator.

Arranging a plurality of nano-column light emitting diodes requires a mirror to be provided on a light emitting diode basis. Since a light emitting apparatus used as the light source of a projector is required to be compact, the mirrors are required to be so arranged not as to increase the size of the projector.

SUMMARY

An aspect of a light emitting apparatus according to the present disclosure includes a substrate, a first light emitter and a second light emitter provided at the substrate, a first mirror that reflects light from the first light emitter, a second mirror that reflects light from the second light emitter, and a support member that has a first hole and a second hole and supports the first mirror and the second mirror. The first light emitter and the second light emitter each include a first semiconductor layer, a second semiconductor layer having a conductivity type different from a conductivity type of the first semiconductor layer, and a light emitting layer provided between the first semiconductor layer and the second semiconductor layer. The first semiconductor layer forms a plurality of columnar sections. The plurality of columnar sections of the first light emitter are disposed in the first hole. The plurality of columnar sections of the second light emitter are disposed in the second hole. The first mirror is provided at a side surface of the support member that defines the first hole. The second mirror is provided at a side surface of the support member that defines the second hole.

In the aspect of the light emitting apparatus, the plurality of columnar sections may form a photonic crystal structure.

In the aspect of the light emitting apparatus, a minimum interval between the plurality of columnar sections may be smaller than or equal to a wavelength of light emitted by the light emitting layer.

In the aspect of the light emitting apparatus, the first light emitter and the second light emitter may each have a core shell structure.

The aspect of the light emitting apparatus may further include a reflection layer provided between the substrate and the first light emitter and between the substrate and the second light emitter.

The aspect of the light emitting apparatus may further include a metal layer that is supported by the support member and connects the first mirror and the second mirror to each other, and thermal conductivity of the metal layer may be higher than thermal conductivity of the support member.

An aspect of a projector according to the present disclosure includes the light emitting apparatus described above.

DESCRIPTION OF EXEMPLARY EMBODIMENTS

Preferable embodiments of the present disclosure will be described below in detail with reference to the drawings. It is not intended that the embodiments described below unduly limit the contents of the present disclosure set forth in the appended claims. Further, all configurations described below are not necessarily essential configuration requirements of the present disclosure.

1. First Embodiment

1.1. Light Emitting Apparatus

Figure 1:
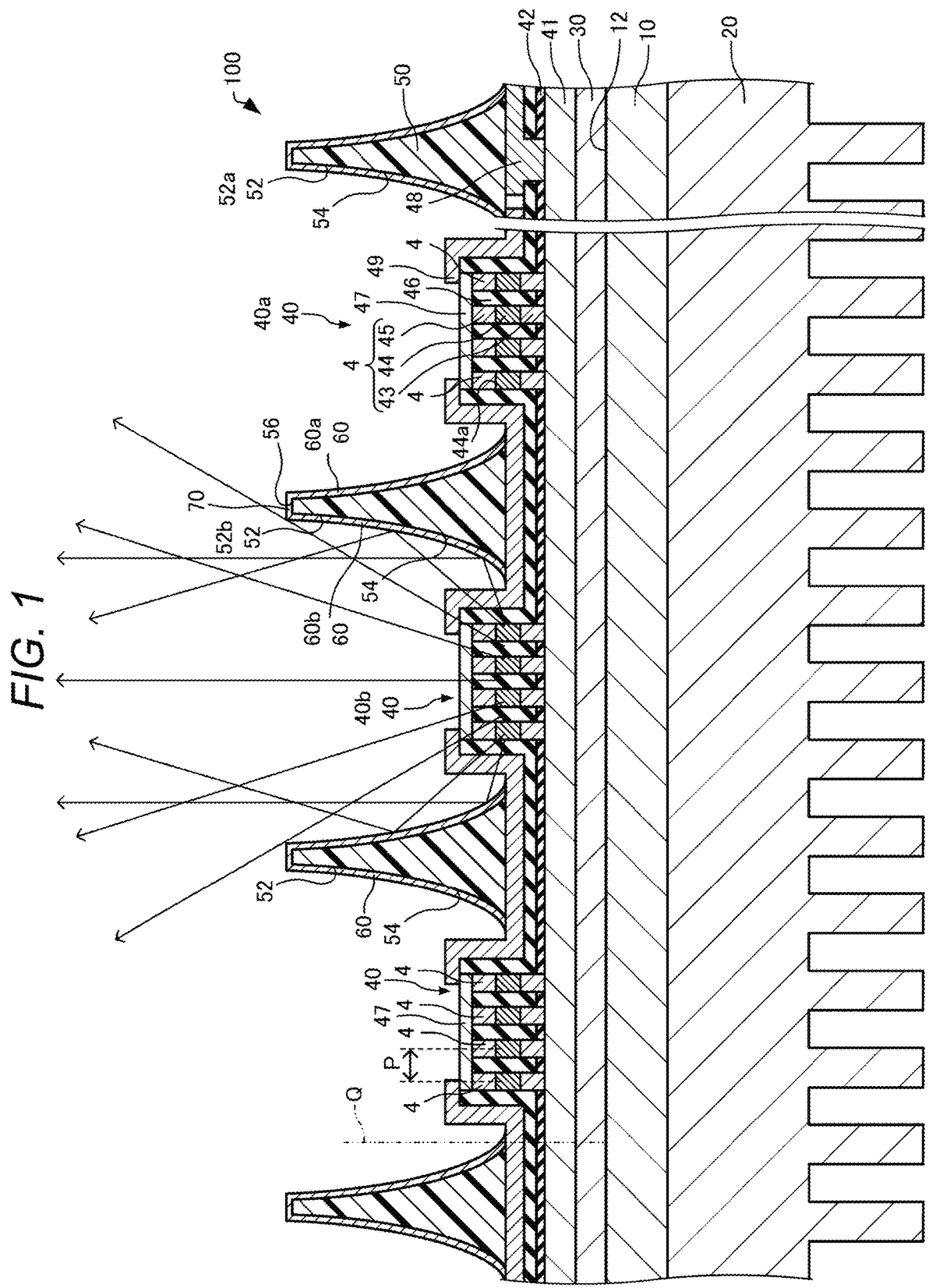
FIG. 1 is a cross-sectional view diagrammatically showing a light emitting apparatus according to a first embodiment.
Figure 2:
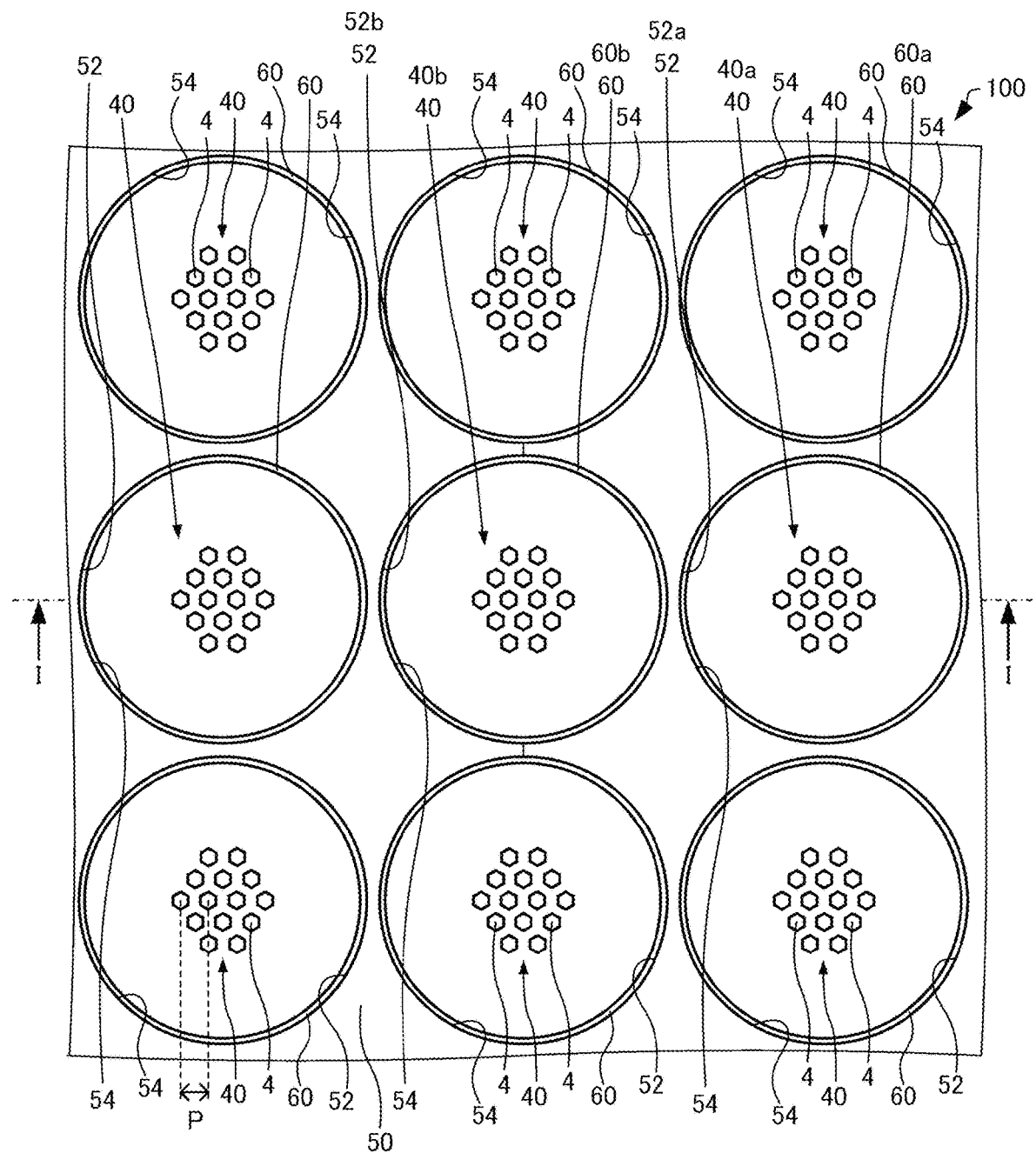
FIG. 2 is a plan view diagrammatically showing the light emitting apparatus according to the first embodiment.

A light emitting apparatus according to a first embodiment will first be described with reference to the drawings. FIG. 1 is a cross-sectional view diagrammatically showing a light emitting apparatus 100 according to the first embodiment. FIG. 2 is a plan view diagrammatically showing the light emitting apparatus 100 according to the first embodiment. FIG. 1 is a cross-sectional view taken along the line I-I in FIG. 2.

The light emitting apparatus 100 includes, for example, a substrate 10, a heat sink 20, a reflection layer 30, light emitters 40, support members 50, mirrors 60, and a metal layer 70, as shown in FIGS. 1 and 2. In FIG. 2, the members excluding columnar sections 4 of the light emitters 40, the support members 50, and the mirrors 60 are omitted for convenience.

The substrate 10 has, for example, a plate-like shape, as shown in FIG. 1. The substrate 10 is, for example, a sapphire substrate. The substrate 10 has a thickness of, for example, about 50 μm. When the thickness of the substrate 10 is about 10 μm, heat generated by the light emitters 40 is likely to be dissipated via the heat sink 20.

The heat sink 20 is provided below the substrate 10. The heat sink 20 is made, for example, of aluminum or copper. The heat sink 20 can dissipate the heat generated by the light emitters 40.

In the present specification, the directions of a perpendicular Q to a surface 12 of the substrate 10, which is the surface facing the light emitter 40, are defined with respect to the substrate 10 as follows: The direction from the substrate 10 toward the heat sink 20 is "lower;" and the direction from the substrate 10 toward the light emitters 40 is "upper."

The reflection layer 30 is provided on the substrate 10. The reflection layer 30 is provided between the substrate 10 and the light emitters 40. The reflection layer 30 is, for example, a distribution Bragg reflector (DBR) layer. The reflection layer 30 is, for example, a laminate formed of an AlGaN layer and a GaN layer alternately layered on each other or an AlInN layer and a GaN layer alternately layered on each other. The reflection layer 30 reflects light produced by light emitting layers 44 toward a second electrode 49.

The light emitters 40 are provided on the reflection layer 30. In the example shown in FIG. 1, the light emitters 40 are provided on the substrate 10 via the reflection layer 30. A plurality light emitters 40 are provided. The plurality of light emitters 40 are arranged in a matrix in a plan view viewed along the direction of the perpendicular Q (hereinafter also simply referred to as "in the plan view"), as shown in FIG. 2. In the example shown in FIG. 2, 9 light emitters 40 are provided, and the number of light emitters 40 is not limited to a specific number as long as a plurality of light emitters 40 are provided.

The light emitters 40 are each an LED. The light emitters 40 each include, for example, a buffer layer 41, a mask layer 42, first semiconductor layers 43, the light emitting layers 44, second semiconductor layers 45, an insulating layer 46, third semiconductor layers 47, a first electrode 48, and the second electrode 49, as shown in FIG. 1.

The buffer layer 41 is provided on the reflection layer 30. The buffer layer 41 is, for example, an n-type GaN layer into which Si has been doped. In the example shown in FIG. 1, the buffer layer 41 is provided as a layer common to the plurality of light emitters 40.

The mask layer 42 is provided on the buffer layer 41. The mask layer 42 is a non-polar layer, such as a silicon oxide layer or a silicon nitride layer. The mask layer 42 is a layer that causes the first semiconductor layers 43, the light emitting layers 44, and the second semiconductor layers 45 to be selectively grown. In the example shown in FIG. 1, the mask layer 42 is provided as a layer common to the plurality of light emitters 40.

The first semiconductor layers 43, the light emitting layers 44, and the second semiconductor layers 45 form the columnar sections 4. The columnar sections 4 are provided on the buffer layer 41. The columnar sections 4 each have a columnar shape protruding upward from the buffer layer 41. The columnar sections 4 each have, for example, a polygonal or circular planar shape. In the example shown in FIG. 2, the planar shape of each of the columnar sections 4 is a regular hexagonal shape. The columnar sections 4 each have a diameter of the order of nanometers, for example, a diameter greater than or equal to 10 nm but smaller than or equal to 500 nm. The size of the columnar sections 4 in the direction of the perpendicular Q is, for example, greater than or equal to 1 μm but smaller than or equal to 5 μm.

The "diameter of each of the columnar sections 4" is defined as follows: In a case where the columnar sections 4 have a circular planar shape, the diameter is the diameter of the circle; and when the columnar sections 4 have a non-circular planar shape, the diameter is the diameter of a minimum inclusion circle of the non-circular shape. For example, when the columnar sections 4 have a polygonal planar shape, the diameter is the diameter of the minimum circle containing the polygon therein, and when the columnar sections 4 have an elliptical planar shape, the diameter is the diameter of the minimum circle containing the ellipse therein.

A plurality of columnar sections 4 are provided in each of the light emitters 40. The number of columnar sections 4 in each of the light emitters 40 ranges from several to several hundreds. The spacing between adjacent columnar sections 4 is, for example, greater than or equal to 1 nm but smaller than or equal to 500 nm. The "spacing between adjacent columnar sections 4" is a minimum distance between adjacent columnar sections 4.

The plurality of columnar sections 4 are arranged in a predetermined direction at predetermined intervals in the plan view. The plurality of columnar sections 4 are arranged, for example, in the form of a triangular lattice or a quadrangular lattice. In the example shown in FIG. 2, the plurality of columnar sections 4 are arranged in the form of a triangular lattice. A minimum interval P between the plurality of columnar sections 4 is smaller than or equal to the wavelength of the light emitted by the light emitting layers 44. Let λ be the wavelength of the light emitted by the light emitting layers 44, and a ratio P/λ of the minimum interval P to λ is, for example, greater than or equal to 0.45 but smaller than or equal to 0.65. The plurality of columnar sections 4 in each of the light emitters 40 form a photonic crystal structure, and the light emitters 40 can provide a photonic crystal effect.

The "interval between the columnar sections 4" is the distance between the centers of columnar sections 4 adjacent to each other in the predetermined direction. The "center of each of the columnar sections 4" is defined as follows: In the case where the columnar sections 4 have a circular planar shape, the center is the center of the circle; and when the columnar sections 4 have a non-circular planar shape, the center is the center of the minimum inclusion circle of the non-circular shape. For example, when the columnar sections 4 have a polygonal planar shape, the center of each of the columnar sections 4 is the center of the minimum circle containing the polygon therein, and when the columnar sections 4 have an elliptical planar shape, the center of each of the columnar sections 4 is the center of the minimum circle containing the ellipse therein.

The first semiconductor layers 43 are provided on the buffer layer 41. The first semiconductor layer 43 is provided between the substrate 10 and the light emitting layers 44. The first semiconductor layers 43 are each, for example, an n-type GaN layer into which Si has been doped.

The light emitting layers 44 are provided on the first semiconductor layers 43. The light emitting layers 44 are provided between the first semiconductor layers 43 and the second semiconductor layers 45. The light emitting layers 44 produce light when current is injected thereinto. The light emitting layers 44 each have, for example, a multi-quantum-well structure in which an i-type GaN layer into which no impurity has been doped and an i-type InGaN layer are alternately layered on each other five times. In the example shown in FIG. 1, an upper surface 44a of each of the light emitting layers 44 is a c plane.

The second semiconductor layers 45 are provided on the light emitting layers 44. The second semiconductor layers 45 are layers different from the first semiconductor layers 43 in terms of conductivity type. The second semiconductor layers 45 are each, for example, a p-type GaN layer into which Mg has been doped.

The insulating layer 46 is provided between adjacent columnar sections 4. The insulating layer 46 is provided around the columnar sections 4 in the plan view. The insulating layer 46 is provided on the mask layer 42. The insulating layer 46 is, for example, a silicon oxide layer. In the example shown in FIGS. 1 and 2, the insulating layer 46 is provided as a layer common to the plurality of light emitters 40.

The third semiconductor layers 47 are provided on the plurality of columnar sections 4 and the insulating layer 46. The third semiconductor layers 47 are each, for example, a p-type GaN layer into which Mg has been doped.

The first electrode 48 is provided on the buffer layer 41. The buffer layer 41 may be in ohmic contact with the first electrode 48. The first electrode 48 is electrically connected to the first semiconductor layers 43. In the example shown in FIG. 1, the first electrode 48 is electrically connected to the first semiconductor layers 43 via the buffer layer 41. The first electrode 48 is one of the electrodes via which current is injected into the light emitting layers 44. The first electrode 48 is, for example, a laminate of a Ti layer, an Al layer, and an Au layer layered in this order from the side facing the buffer layer 41. In the example shown in FIG. 1, the first electrode 48 is provided as an electrode common to the plurality of light emitters 40.

The second electrode 49 is provided on the third semiconductor layers 47. The third semiconductor layers 47 may be in ohmic contact with the second electrode 49. In the example shown in FIG. 1, the second electrode 49 is provided also on the insulating layer 46. The second electrode 49 is electrically connected to the second semiconductor layers 45. In the example shown in FIG. 1, the second electrode 49 is electrically connected to the second semiconductor layers 45 via the third semiconductor layers 47. The second electrode 49 is the other one of the electrodes via which current is injected into the light emitting layers 44. The second electrode 49 is, for example, a laminate of an Al layer and a Ti layer layered in this order from the side facing the third semiconductor layers 47. In the example shown in FIG. 1, the second electrode 49 is provided as an electrode common to the plurality of light emitters 40.

In each of the light emitters 40, the p-type second semiconductor layer 45, the i-type light emitting layer 44, and the n-type first semiconductor layer 43 form a pin diode. In each of the light emitters 40, when forward bias voltage for the pin diode is applied to the gap between the first electrode 48 and the second electrode 49, current is injected into the light emitting layers 44, resulting in electron-hole recombination in the light emitting layers 44. The recombination causes light emission. The photonic crystal effect provided by the plurality of columnar sections 4 causes ±1st-order diffracted light out of the light produced in the light emitting layers 44 to travel in the direction of the perpendicular Q. The light from the light emitting layers 44 toward the second semiconductor layers 45 exits out of the third semiconductor layers 47. The light from the light emitting layers 44 toward the first semiconductor layers 43 is reflected off the reflection layer 30 and exits out of the third semiconductor layers 47.

The support member 50 is provided on the second electrode 49. The support member 50 may be glued to the second electrode 49. In the example shown in FIG. 1, the support member 50 is provided on the substrate 10 via the reflection layer 30, the buffer layer 41, the mask layer 42, the insulating layer 46, and the second electrode 49. The support member 50 supports the mirrors 60.

The support member 50 has holes 52. A plurality of holes 52 are provided in correspondence with the plurality of light emitters 40. The plurality of columnar sections 4 are disposed in the holes 52. The plurality of columnar sections 4 overlap with the holes 52 in the plan view. The plurality of columnar sections 4 of a first light emitter 40a out of the plurality of light emitters 40 are disposed in a first hole 52a out of the plurality of holes 52. The plurality of columnar sections 4 of the first light emitter 40a overlap with the first hole 52a in the plan view. The plurality of columnar sections 4 of a second light emitter 40b out of the plurality of light emitters 40 are disposed in a second hole 52b out of the plurality of holes 52. The plurality of columnar sections 4 of the second light emitter 40b overlap with the second hole 52b in the plan view. In the example shown in FIG. 2, the holes 52 each have a circular planar shape. The support member 50 is made, for example, of resin.

The mirrors 60 are supported by the support member 50. A plurality of mirrors 60 are provided in correspondence with the plurality of holes 52. The mirrors 60 are provided on side surfaces 54 of the support member 50, which define the holes 52. The mirrors 60 may be provided across the entire side surfaces 54. The mirrors 60 reflect the light from the light emitters 40. A first mirror 60a out of the plurality of mirrors 60 reflects the light from the first light emitter 40a. The first mirror 60a is provided on the side surface 54 of the support member 50 that defines the first hole 52a. A second mirror 60b out of the plurality of mirrors 60 reflects the light from the second light emitter 40b. The second mirror 60b is provided on the side surface 54 of the support member 50 that defines the second hole 52b. The mirrors 60 are made, for example, of an aluminum-based alloy or a silver-based alloy. The mirrors 60 may be connected to the second electrode 49. The mirrors 60 can reduce the radiation angle of the light emitted from the light emitters 40.

The metal layer 70 is supported by the support member 50. The metal layer 70 is provided, for example, on an upper surface 56 of the support member 50. The upper surface 56 is a surface that connects adjacent side surfaces 54 to each other. The metal layer 70 may be provided across the entire upper surface 56. The metal layer 70 connects the plurality of mirrors 60 to each other. The metal layer 70 connects the first mirror 60a and the second mirror 60b to each other. The thermal conductivity of the metal layer 70 is higher than the thermal conductivity of the support member 50. The material of the metal layer 70 is, for example, the same material of the support member 50.

Although not shown, a protective glass plate that protects the light emitters 40 may be provided as required on the support member 50.

The light emitting apparatus 100 provides, for example, effects described below.

The light emitting apparatus 100 includes the support member 50, which supports the first mirror 60a and the second mirror 60b, with the plurality of columnar sections 4 of the first light emitter 40a disposed in the first hole 52a in the support member 50 and the plurality of columnar sections 4 of the second light emitter 40b disposed in the second hole 52b in the support member 50. The first mirror 60a is provided on the side surface 54 of the support member 50 that defines the first hole 52a, and the second mirror 60b is provided on the side surface 54 of the support member 50 that defines the second hole 52b. As described above, in the light emitting apparatus 100, the first mirror 60a and the second mirror 60b can be supported by the common support member 50. The size of the light emitting apparatus 100 can therefore be reduced as compared with a case where the first and second mirrors are supported by separate support members.

In the light emitting apparatus 100, the plurality of columnar sections 4 each form a photonic crystal structure. Therefore, in the light emitting apparatus 100, ±1st-order diffracted light out of the light produced in the light emitting layers 44 is allowed to exit in the direction of the perpendicular Q. The light can thus be collected in the direction of the perpendicular Q.

The light emitting apparatus 100 includes the reflection layer 30 provided between the substrate 10 and the first light emitter 40a and between the substrate 10 and the second light emitter 40b. Therefore, in the light emitting apparatus 100, the light from the light emitting layers 44 toward the first semiconductor layers 43 can be reflected off the reflection layer 30 toward the second semiconductor layers 45.

The light emitting apparatus 100 includes the metal layer 70, which is supported by the support member 50 and connects the first mirrors 60 and the second mirror 60b to each other. The light emitting apparatus 100 can therefore have high heat dissipation capability as compared with a case where no metal layer is provided.

The InGaN-based light emitting layers 44 have been described above, and the light emitting layers 44 can instead be made of any material capable of emitting light when current is injected to the material in accordance with the wavelength of the light to be emitted from the material. For example, the light emitting layers 44 may be made, for example, of an AlGaN-based, AlGaAs-based, InGaAs-based, InGaAsP-based, InP-based, GaP-based, or AlGaP-based semiconductor material.

1.2. Method for Manufacturing Light Emitting Apparatus

Figure 3:
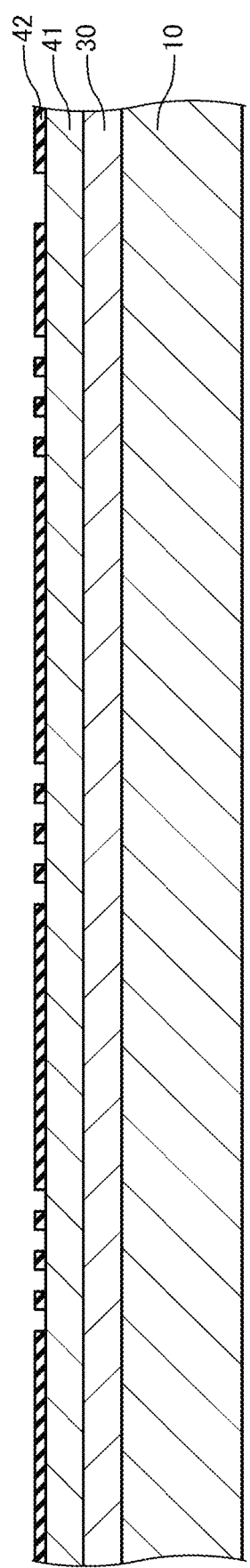
FIG. 3 is a cross-sectional view diagrammatically showing the steps of manufacturing the light emitting apparatus according to the first embodiment.

A method for manufacturing the light emitting apparatus 100 according to the first embodiment will next be described with reference to the drawings. FIG. 3 is a cross-sectional view diagrammatically showing the steps of manufacturing the light emitting apparatus 100 according to the first embodiment.

The reflection layer 30 and the buffer layer 41 are formed in this order on the substrate 10 in an epitaxial growth process, as shown in FIG. 3. The epitaxial growth may be achieved, for example, by using a metal organic chemical vapor deposition (MOCVD) method or a molecular beam epitaxy (MBE) method.

The mask layer 42 is then formed on the buffer layer 41, for example, by using the MOCVD method, the MBE method, or a sputter method. The mask layer 42 is then patterned into a predetermined shape.

The mask layer 42 is used as a mask, and the first semiconductor layers 43, the light emitting layers 44, and the second semiconductor layers 45 are formed in this order on the buffer layer 41 in an epitaxial growth process, as shown in FIG. 1. The epitaxial growth may be achieved, for example, by using the MOCVD method or the MBE method. The columnar sections 4 can be formed by carrying out the present step.

In the step of forming the columnar sections 4, no etching damage occurs. Etching damage occurs, for example, when a laminate of the first semiconductor layer, the light emitting layer, and the second semiconductor layer is formed and the laminate is then etched to form the columnar sections each including the first semiconductor layer, the light emitting layer, and the second semiconductor layer.

The insulating layer 46 is then so formed, for example, by using a spin-on-glass (SOG) method as to cover the columnar sections 4.

The first electrode 48 is then formed on the buffer layer 41. The first electrode 48 is formed, for example, by using a vacuum evaporation method. For example, when the first electrode 48 is patterned by etching, the insulating layer 46, which covers the columnar sections 4, functions as a protective layer that protects the columnar sections 4 from the etching.

The insulating layer 46 is then etched to expose the second semiconductor layers 45 of the columnar sections 4. Thereafter, to form the third semiconductor layers 47 on the second semiconductor layers 45 by epitaxial growth, the MOCVD method or the MBE method may, for example, be used. It is noted that the first electrode 48 may be formed after the third semiconductor layers 47 are formed.

The second electrode 49 is then formed on the third semiconductor layers 47. The second electrode 49 is formed, for example, by the vacuum evaporation method. The light emitters 40 can be formed by carrying out the steps described above. It is noted that the first electrode 48 may be formed after the second electrode 49 is formed.

The support member 50 on which the mirrors 60 and the metal layer 70 have been formed is then glued to the second electrode 49.

The lower surface of the substrate 10 is then polished as required, and the heat sink 20 is then glued to the lower surface of the substrate 10.

The light emitting apparatus 100 can be manufactured by carrying out the steps described above.

When the spacing between the columnar sections 4 of adjacent light emitters 40 is small, for example, ranging from several μm to ten-odd μm, the support member 50 may be monolithically formed on the light emitters 40. Specifically, an ITO (indium tin oxide) layer is formed as the second electrode 49 on the third semiconductor layers 47, and a silicon oxide layer is formed on the second electrode 49 to a thickness of, for example, about 5 μm. Dry etching using a predetermined mask layer is then performed with the ITO layer used as an etching stopper layer to provide the holes 52 having a desired shape. The mirrors 60 are then formed on the side surfaces 54 of the support member 50, which define the holes 52, and the metal layer 70 is formed on the upper surface 56. In this case, the mirrors 60 and the metal layer 70 function as wiring that connects adjacent ITO layers to each other.

1.3. Variation

Figure 4:
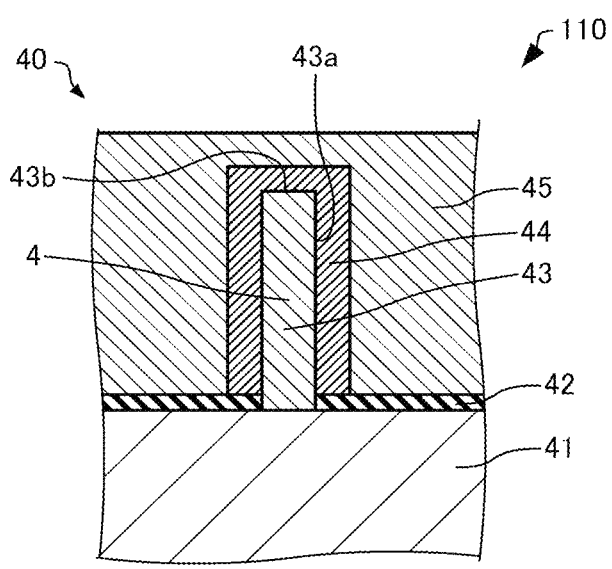
FIG. 4 is a cross-sectional view diagrammatically showing a light emitting apparatus according to a variation of the first embodiment.

A light emitting apparatus according to a variation of the first embodiment will next be described with reference to the drawings. FIG. 4 is a cross-sectional view diagrammatically showing a first semiconductor layer 43, a light emitting layer 44, and a second semiconductor layer 45 of a light emitting apparatus 110 according to the variation of the first embodiment.

In the light emitting apparatus 110 according to the variation of the first embodiment in the following description, a member having the same function as that of a constituent member of the light emitting apparatus 100 according to the first embodiment described above has the same reference character and will not be described in detail.

In the light emitting apparatus 100 described above, the columnar sections 4 are each formed of the first semiconductor layer 43, the light emitting layer 44, and the second semiconductor layer 45, as shown in FIG. 1. In contrast, in the light emitting apparatus 110, the columnar sections 4 are each formed only of the first semiconductor layer 43, as shown in FIG. 4.

In the light emitting apparatus 110, the light emitters 40 each have a core shell structure. The light emitting layer 44 is provided on a side surface 43a and an upper surface 43b of the first semiconductor layer 43. The side surface 43a of the first semiconductor layer 43 is an m surface. The upper surface 43b of the first semiconductor layer 43 is, for example, a c surface. In the example shown in FIG. 4, the light emitting layer 44 is in contact with the mask layer 42. The second semiconductor layer 45 is so provided as to cover the light emitting layer 44. In the example shown in FIG. 4, the second semiconductor layer 45 is in contact with the mask layer 42.

In the process of growing the light emitting layer 44, the light emitting layer 44 can be provided not only on the c surface but on them surface by adjusting the proportion of a raw material gas. In the core shell structure, the raw material gas supply scheme makes it difficult to reduce the spacing between adjacent columnar sections 4, and the light emitters 40 are therefore unlikely to provide the photonic crystal effect.

In the light emitting apparatus 110, in which the light emitters 40 each have the core shell structure, the light emitters 40 can emit a large amount of light in the direction of a perpendicular to the side surface 43a (direction orthogonal to direction of perpendicular Q shown in FIG. 1). The amount of light reflected off the mirrors 60 can therefore be increased.

In the light emitting apparatus 110, the minimum interval between the plurality of columnar sections 4 is greater, for example, than the wavelength of the light produced by the light emitting layer 44. The light emitters 40 can therefore emit a large amount of light in the direction of a perpendicular to the side surfaces 43a with no photonic crystal effect provided.

2. Second Embodiment

2.1. Light Emitting Apparatus

Figure 5:
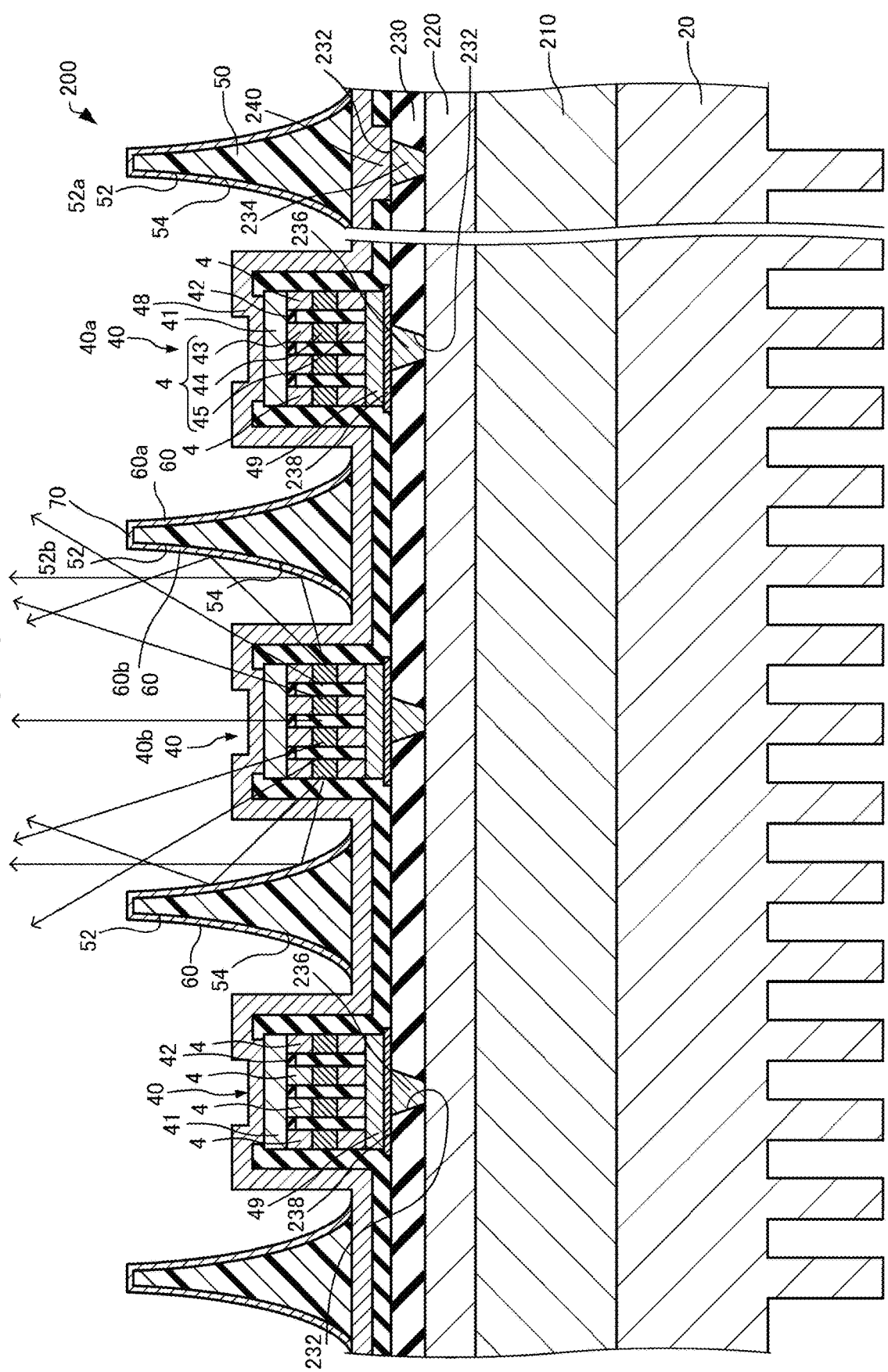
FIG. 5 is a cross-sectional view diagrammatically showing a light emitting apparatus according to a second embodiment.
Figure 6:
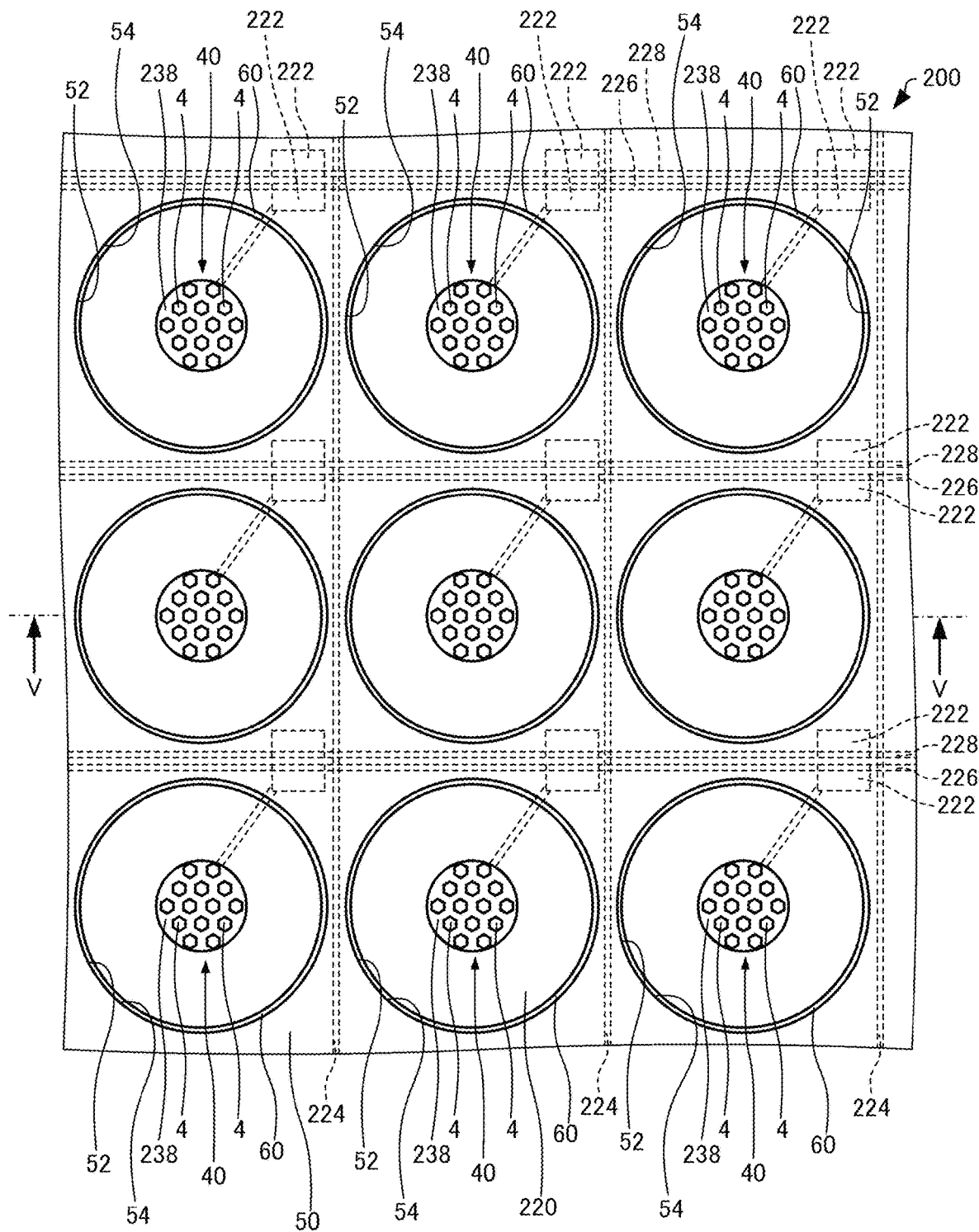
FIG. 6 is a plan view diagrammatically showing the light emitting apparatus according to the second embodiment.

A light emitting apparatus according to a second embodiment will next be described with reference to the drawings. FIG. 5 is a cross-sectional view diagrammatically showing a light emitting apparatus 200 according to the second embodiment. FIG. 6 is a plan view diagrammatically showing the light emitting apparatus 200 according to the second embodiment. FIG. 5 is a cross-sectional view taken along the line V-V in FIG. 6.

In the light emitting apparatus 200 according to the second embodiment in the following description, a member having the same function as that of a constituent member of the light emitting apparatus 100 according to the first embodiment described above has the same reference character and will not be described in detail.

In the light emitting apparatus 100 described above, the distance between the substrate 10 and the first semiconductor layers 43 is smaller than the distance between the substrate 10 and the second semiconductor layers 45, as shown in FIG. 1. In contrast, in the light emitting apparatus 200, the distance between a substrate 210 and the second semiconductor layers 45 is smaller than the distance between the substrate 210 and the first semiconductor layers 43, as shown in FIG. 5.

The light emitting apparatus 200 includes, for example, the substrate 210, a drive circuit substrate 220, and a spacer 230, as shown in FIGS. 5 and 6.

In the light emitting apparatus 200, the light emitters 40 are mounted on the substrate 210 in a junction down manner. The light emitters 40 are each so mounted that the second electrode 49 faces the substrate 210. In the example shown in FIG. 5, the light emitters 40 are provide on the substrate 210 via the drive circuit substrate 220, the spacer 230, and metal pads 238.

The substrate 210 is, for example, a silicon substrate. Using s silicon substrate as the substrate 210 allows improvement in heat dissipation capability of the light emitting apparatus 200 as compared with a case where the sapphire substrate is used.

The drive circuit substrate 220 is provided between the substrate 210 and the light emitters 40. The drive circuit substrate 220 includes a drive circuit for driving the light emitters 40. The drive circuit is achieved, for example, by CMOS (complementary metal oxide semiconductor) devices.

The spacer 230 is provided between the drive circuit substrate 220 and the light emitters 40. The spacer 230 is made of an insulating material. The spacer 230 has a plurality of through holes 232 provided therein. First contacts 234 and second contacts 236 are provided in the plurality of through holes 232. The first contacts 234 electrically connect the first electrode 48 to the drive circuit substrate 220. The second contacts 236 electrically connect the second electrode 49 to the drive circuit substrate 220. The metal pads 238 are made, for example, of titanium.

The first electrode 48 is connected to a common electrode pad 240. The first electrode 48 is electrically connected to the drive circuit substrate 220 via the common electrode pad 240 and the first contacts 234. The first electrode 48 is made, for example, of ITO. In the example shown in FIG. 5, the first electrode 48 is provided as an electrode common to the plurality of light emitters 40. The buffer layer 41 is provided for each of the light emitters 40.

The second electrode 49 is provided between the second contacts 236 and the second semiconductor layers 45. The second electrode 49 is provided for each of the light emitters 40. The light emitted from the light emitting layers 44 and traveling from the light emitting layers toward the second semiconductor layers 45 is reflected off the second electrodes 49 and exits out of the first electrode 48.

The support member 50 is glued, for example, to the first electrode 48. In the example shown in FIG. 5, the support member 50 is provided on the first electrode 48 via the drive circuit substrate 220, the spacer 230, the insulating layer 46, and the first electrode 48.

The drive circuit substrate 220 includes transistors 222, data lines 224, feeder lines 226, and scan lines 228, as shown in FIG. 6. FIG. 5 does not show the data lines 224 for convenience. In FIG. 6, the members other than the columnar sections 4, the support member 50, the mirrors 60, the drive circuit substrate 220, and the metal pads 238 are omitted.

A plurality of data lines 224 are provided. The feeder lines 226 intersect, for example, the data lines 224 at right angles. A plurality of feeder lines 226 are provided. The scan lines 228 are parallel, for example, to the feeder lines 226. A plurality of scan lines 228 are provided. Two transistors 222 are provided for each of the light emitters 40. The transistors 222, the data lines 224, the feeder lines 226, and the scan lines 228 can drive the plurality of light emitters 40 independently of one another to display video images. The drive circuit can drive the light emitters 40 based, for example, on inputted image information. One light emitter 40 can therefore form one pixel. The light emitting apparatus 200 is, for example, a self-luminous image display.

In the light emitting apparatus 200, the plurality of light emitters 40 may emit light having the same wavelength, or light emitters 40 that emit red light, light emitters 40 that emit green light, and light emitters 40 that emit blue light may be alternately arranged.

The light emitting apparatus 200, which emits light having high directivity and high luminance, is optimum for a projector that will be described later, an HMD (head mounted display), and an HUD (head-up display).

2.2. Method for Manufacturing Light Emitting Apparatus

Figure 7:
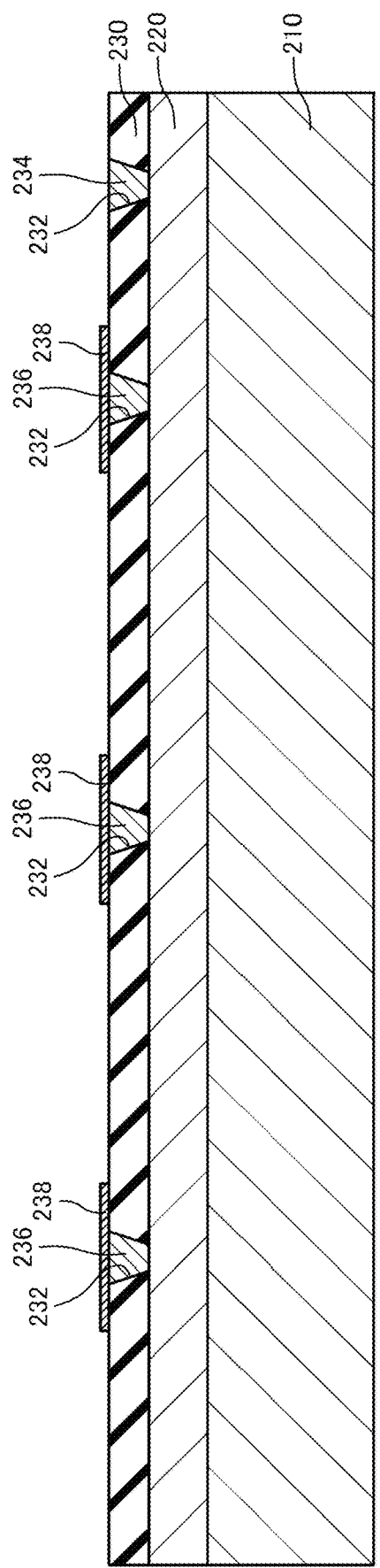
FIG. 7 is a cross-sectional view diagrammatically showing the steps of manufacturing the light emitting apparatus according to the second embodiment.

A method for manufacturing the light emitting apparatus 200 according to the second embodiment will next be described with reference to the drawings. FIG. 7 is a cross-sectional view diagrammatically showing the steps of manufacturing the light emitting apparatus 200 according to the second embodiment.

In the method for manufacturing the light emitting apparatus 200, the light emitters 40 are formed by growing the buffer layer 41, the first semiconductor layer 43, the light emitting layer 44, and the second semiconductor layer 45 on the substrate 10, then forming the insulating layer 46, and then forming the second electrode 49 on the second semiconductor layer 45 and the insulating layer 46. After the second electrode 49 is formed, the substrate 10 is removed. The description of the above-mentioned method for manufacturing the light emitting apparatus 100 can be applied to the method for forming the buffer layer 41, the first semiconductor layers 43, the light emitting layers 44, the second semiconductor layers 45, the insulating layer 46, and the second electrode 49.

Thereafter, the drive circuit substrate 220 is disposed on the substrate 210, and the spacer 230 is disposed on the drive circuit substrate 220, as shown in FIG. 7. Thereafter, the through holes 232 are formed in the spacer 230, and the contacts 234 and 236 are formed in the through holes 232. The contacts 234 and 236 are formed, for example, by using a sputter method or a CVD (chemical vapor deposition) method. The metal pads 238 are then formed on the second contacts 236. The metal pads 238 are formed, for example, by using the sputter method or the CVD method.

The second electrodes 49 of the light emitters 40 are then bonded to the metal pads 238, as shown in FIG. 5. For example, the surfaces of the second electrodes 49 and the metal pads 238 are sufficiently smoothened and cleaned and then pressurized and heated to cause the titanium in the second electrodes 49 and the titanium in the metal pads 238 form a metal-metal bond.

Thereafter, for example, the first electrode 48 is formed across the entire surface of the structure, and the support member 50 on which the mirrors 60 and the metal layer 70 have been formed is then disposed on the first electrode 48. The heat sink 20 is then disposed on the substrate 210.

The light emitting apparatus 200 can be manufactured by carrying out the steps described above.

3. Third Embodiment

Figure 8:
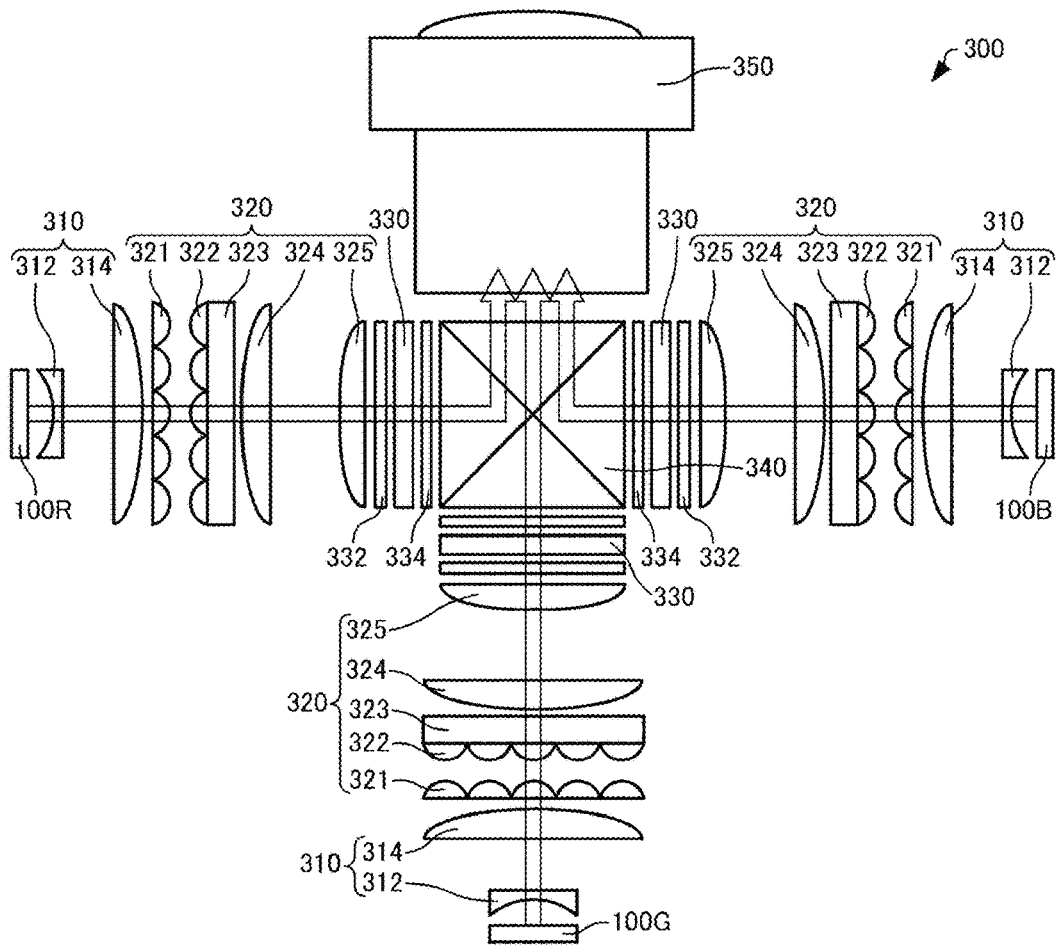
FIG. 8 diagrammatically shows a projector according to a third embodiment.

A projector according to a third embodiment will next be described with reference to the drawings. FIG. 8 diagrammatically shows a projector 300 according to the third embodiment.

The projector 300 includes, for example, the light emitting apparatus 100 as the light source.

The projector 300 includes a red light source 100R, which outputs red light, a green light source 100G, which outputs green light, and a blue light source 100B, which outputs blue light, as shown in FIG. 8. FIG. 8 shows the red light source 100R, the green light source 100G, and the blue light source 100B in a simplified manner for convenience.

The projector 300 further includes, for example, pickup systems 310, optical integration systems 320, light modulators 330, a cross dichroic prism 340, and a projection lens 350.

The pickup systems 310 cause the light fluxes outputted from the light sources 100R, 100G, and 100B to converge. Three pickup systems 310 are provided in correspondence with the light sources 100R, 100G, and 100B. In the example shown in FIG. 8, the pickup systems 310 are each formed of a first pickup lens 312 and a second pickup lens 314. The light fluxes having exited out of the pickup systems 310 enter the optical integration systems 320.

The optical integration systems 320 homogenize the intensities of the light fluxes having exited out of the pickup systems 310 and convert the light fluxes in terms of polarization. Three optical integration systems 320 are provided in correspondence with the light sources 100R, 100G, and 100B. In the example shown in FIG. 8, the optical integration systems 320 are each formed of a first lens array 321, a second lens array 322, a polarization converter 323, a condenser lens 324, and a field lens 325. The light fluxes having exited out of the optical integration systems 320 enter the light modulators 330.

The light modulators 330 modulate the light fluxes having exited out of the optical integration systems 320 in accordance with image information. Three light modulators 330 are provided in correspondence with the light sources 100R, 100G, and 100B. The light modulators 330 are transmissive liquid crystal light valves that transmit the light fluxes outputted from the light sources 100R, 100G, and 100B. The projector 300 is an LCD (liquid crystal display) projector.

In the example shown in FIG. 8, the projector 300 includes light-incident-side polarizers 332 and light-exiting-side polarizers 334. The light-incident-side polarizers 332 adjust the polarization states of the light fluxes outputted from the light sources 100R, 100G, and 100B and cause the adjusted light fluxes to enter the light modulators 330. The light-exiting-side polarizers 334 analyze the light fluxes having passed through the light modulators 330 and cause the analyzed light fluxes to enter the cross dichroic prism 340. When the light fluxes outputted from the light sources 100R, 100G, and 100B are linearly polarized light fluxes, the light-incident-side polarizers 332 may not be provided.

The cross dichroic prism 340 combines the light flux outputted from the red light source 100R and modulated by the corresponding light modulator 330, the light flux outputted from the green light source 100G and modulated by the corresponding light modulator 330, and the light flux outputted from the blue light source 100B and modulated by the corresponding light modulator 330 with one another. The cross dichroic prism 340 is formed by sticking four right-angled prisms to each other, and a dielectric multilayer film that reflects the red light and a dielectric multilayer film that reflects the blue light are disposed on the internal surfaces of the cross dichroic prism 340. The dielectric multilayer films combine the three color light fluxes with one another to form light representing a color image. The combined light from the cross dichroic prism 340 enters the projection lens 350.

The projection lens 350 projects the combined light from the cross dichroic prism 340 on a screen that is not shown. An enlarged image is displayed on the screen.

The projector 300 includes the light sources 100R, 100G, and 100B. The light sources 100R, 100G, and 100B each output a light flux having a small radiation angle and therefore allow the light flux to efficiently enter the projection lens 350. A projection lens 350 having a large F-number and a small diameter can be used. Further, the light sources 100R, 100G, and 100B each generate only a small amount of heat, so that a cooler, if provided, can be a compact one. The size of the projector 300 can therefore be reduced.

4. Fourth Embodiment

Figure 9:
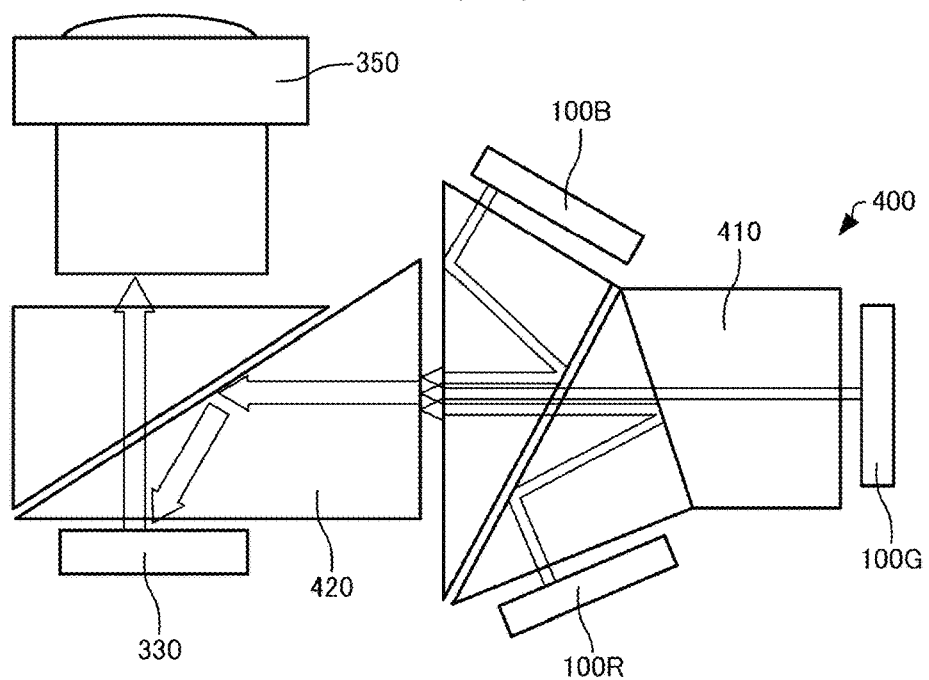
FIG. 9 diagrammatically shows a projector according to a fourth embodiment.

A projector according to a fourth embodiment will next be described with reference to the drawings. FIG. 9 diagrammatically shows a projector 400 according to the fourth embodiment.

In the projector 400 according to the fourth embodiment in the following description, a member having the same function as that of a constituent member of the projector 300 according to the third embodiment described above has the same reference character and will not be described in detail.

In the projector 300 described above, the light modulators 330 are transmissive liquid crystal light valves that transmit the light fluxes outputted from the light sources 100R, 100G, and 100B, and three light modulators 330 are provided, as shown in FIG. 8.

In contrast, in the projector 400, the light modulator 330 is a digital micromirror device (DMD) that reflects the light fluxes outputted from the light sources 100R, 100G, and 100B, and one light modulator 330 is provided, as shown in FIG. 9. The projector 400 is a digital light processing (DLP) projector.

The projector 400 includes, for example, the light sources 100R, 100G, and 100B, the light modulator 330, a Phillips prism 410, and a total internal reflection (TIR) prism 420.

The light fluxes outputted from the light sources 100R, 100G, and 100B enter the Phillips prism 410. The Phillips prism 410 combines the light fluxes outputted from the light sources 100R, 100G, and 100B with one another. The combined light from the Phillips prism 410 enters the TIR prism 420.

The TIR prism 420 causes the combined light from the Phillips prism 410 to enter the light modulator 330. Further, the TIR prism 420 causes the light modulated by the light modulator 330 to enter the projection lens 350.

The projector 400 includes the light modulator 330 that is a DMD. The light modulator 330 that is a DMD is a display apparatus that requires no polarized light unlike a liquid-crystal-based display apparatus. A polarization converter, such as that in the projector 300, is therefore not required. Further, since the light sources 100R, 100G, and 100B output light fluxes having highly uniform intensity, so that no optical integration system is required. The size of the projector 400 can therefore be reduced.

5. Fifth Embodiment

Figure 10:
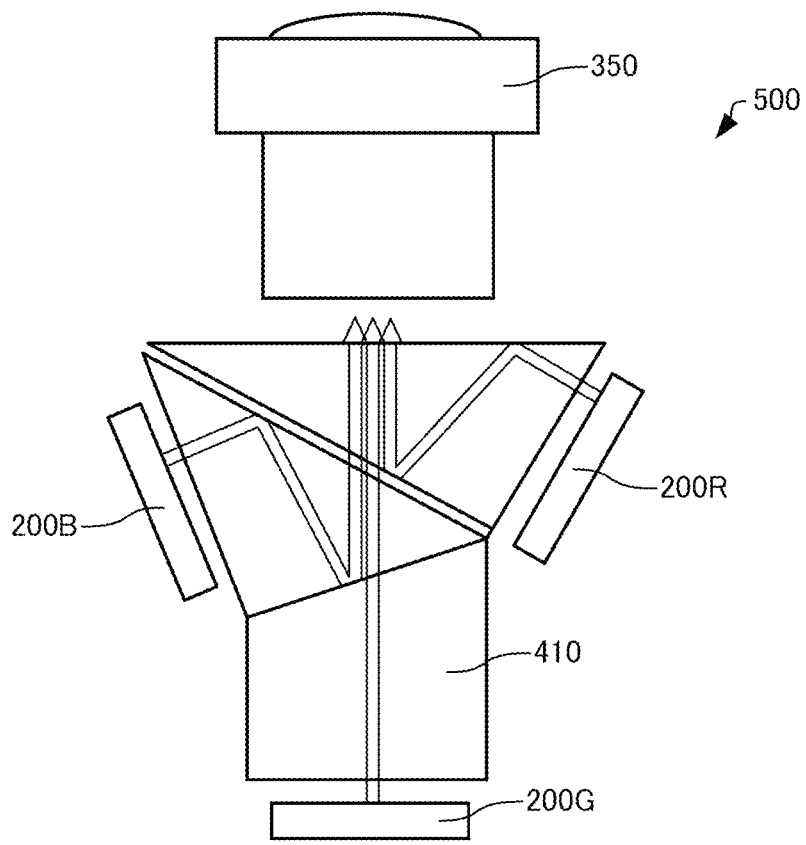
FIG. 10 diagrammatically shows a projector according to a fifth embodiment.

A projector according to a fifth embodiment will next be described with reference to the drawings. FIG. 10 diagrammatically shows a projector 500 according to the fifth embodiment.

In the projector 500 according to the fifth embodiment in the following description, a member having the same function as that of a constituent member of the projector 400 according to the fourth embodiment described above has the same reference character and will not be described in detail.

The projector 400 described above includes the light emitting apparatus 100 as the light source, as shown in FIG. 9. In contrast, the projector 500 includes the light emitting apparatus 200 as the light source.

The projector 500 includes a red light source 200R, which outputs red light, a green light source 200G, which outputs green light, and a blue light source 200B, which outputs blue light, as shown in FIG. 10. The light sources 200R, 200G, and 200B are each a self-luminous image display capable of forming pixels. The projector 500 therefore includes no light modulator separately. The size of the projector 500 can therefore be reduced.

The light fluxes outputted from the light sources 200R, 200G, and 200B are combined in the Phillips prism 410, and the combined light enters the projection lens 350.

The light emitting apparatuses according to the present disclosure can also each be used as a backlight for a direct-view display, for example, a liquid crystal display in addition to the projector application described above. In this case, increasing the spacing between the centers of adjacent light emitters 40 to at least several hundreds of micrometers does not affect the image quality, and it is therefore uneconomical to use an expensive sapphire substrate with no change, as does the light emitting apparatus 100. It is therefore desirable to divide the sapphire substrate and mount them on a broader substrate.

The light emitting apparatuses according to the present disclosure can further each be used in an illumination application, such as a headlamp of an automobile. A compact illuminator can thus be achieved.

The light emitting apparatuses according to the present disclosure, which are each a highly efficient light emitting apparatus, can also be used in a direct view application that requires both outdoor visibility and low power consumption, such as a watch and a smartphone.

The projectors according to the present disclosure can also each be used in a projector-based apparatus, such as an HMD and an HUD.

6. Experimental Example

A simulation has been conducted on light orientation. The simulation has been conducted by using the following models: A light emitter having a c-plane light emitting structure including columnar sections that each emit light primarily via the c plane of the light emitting layer, such as any of the light emitters shown in FIG. 1; a light emitter having the core shell structure shown, such as the light emitter shown in FIG. 4; and a light emitter having a thin film structure including no columnar section, such as a light emitter shown in FIG. 11.

Figure 11:
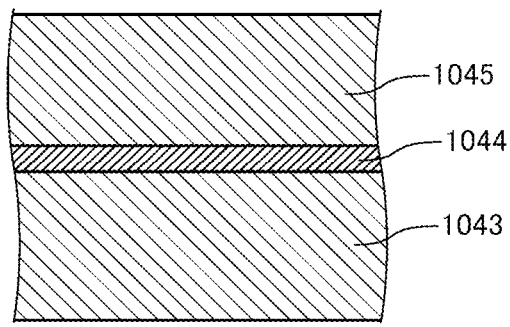
FIG. 11 is a cross-sectional view diagrammatically showing a light emitter having a thin film structure.

FIG. 11 is a cross-sectional view diagrammatically showing the light emitter having a thin film structure including no columnar section. The light emitter having the thin film structure includes a first semiconductor layer 1043, a light emitting layer 1044, and a second semiconductor layer 1045.

The wavelength of the light emitted by the light emitting layer was set at 450 nm. The minimum interval between the columnar sections having the c-plane light emitting structure was set at 200 nm. The minimum interval between the columnar sections having the core shell structure was set at 1 μm.

Figure 12:
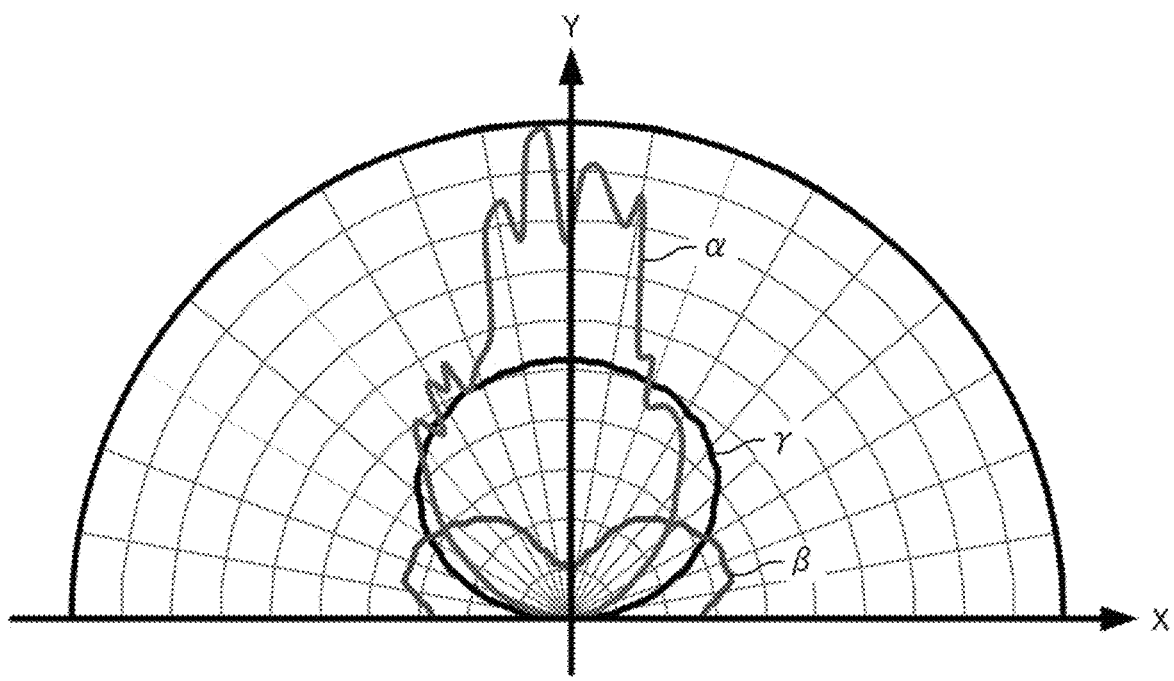
FIG. 12 shows the result of a simulation on light orientation.

FIG. 12 shows the result of the simulation on the light orientation of a light emitter α having the c-plane light emitting structure, a light emitter β having the core shell structure, and a light emitter γ having the thin film structure. In FIG. 12, the axis X is an in-plane direction of the substrate (direction orthogonal to direction of perpendicular to base), and the axis Y is the direction of a perpendicular to the substrate. The light emitters are each disposed at the intersection of the axes X and Y.

In the c-plane light emitting structure, the light concentrates in the direction of the perpendicular as compared with the situation in the thin film structure, as shown in FIG. 12. It is found that the c-plane light emitting structure can enhance the light concentration performance based on the photonic crystal effect as compared with the thin film structure.

In the core shell structure, a large amount of light exits in the in-plane directions, as compared with the thin film structure. It is therefore found that the core shell structure can increase the light reflected off the mirrors as compared with the thin film structure.

In the present disclosure, part of the configuration thereof may be omitted and the embodiments and variations may be combined with each other to the extent that the features and effects described in the present application are provided.

The present disclosure is not limited to the embodiments described above, and a variety of variations are conceivable. For example, the present disclosure encompasses substantially the same configuration as the configuration described in each of the embodiments. The substantially the same configuration is, for example, a configuration having the same function, using the same method, and providing the same result or a configuration having the same purpose and providing the same effect. Further, the present disclosure encompasses a configuration in which an inessential portion of the configuration described in each of the embodiments is replaced. Moreover, the present disclosure encompasses a configuration that provides the same effects and advantages as those provided by the configuration described in each of the embodiments or a configuration that can achieve the same purpose as that achieved by the configuration described in each of the embodiments. Further, the present disclosure encompasses a configuration in which a known technology is added to the configuration described in each of the embodiments.

What is claimed is:

1. A light emitting apparatus comprising:
a substrate;
a first light emitter and a second light emitter provided at the substrate;
a first mirror that reflects light from the first light emitter;
a second mirror that reflects light from the second light emitter; and
a support member that has a first hole and a second hole and supports the first mirror and the second mirror,
wherein the first light emitter and the second light emitter each include:
a first semiconductor layer,
a second semiconductor layer having a conductivity type different from a conductivity type of the first semiconductor layer,
and a light emitting layer provided between the first semiconductor layer and the second semiconductor layer, the first semiconductor layer forms a plurality of columnar sections;
the plurality of columnar sections of the first light emitter are disposed in the first hole,
the plurality of columnar sections of the second light emitter are disposed in the second hole,
the first mirror is provided at a first side surface of the support member,
the first side surface defines the first hole,
the second mirror is provided at a second side surface of the support member, and
the second side surface defines the second hole.

2. The light emitting apparatus according to claim 1, wherein the plurality of columnar sections form a photonic crystal structure.

3. The light emitting apparatus according to claim 1, wherein a minimum interval between the plurality of columnar sections is smaller than or equal to a wavelength of light emitted by the light emitting layer.

4. The light emitting apparatus according to claim 1, wherein the first light emitter and the second light emitter each have a core shell structure.

5. The light emitting apparatus according to claim 1, further comprising a reflection layer provided between the substrate and the first light emitter and between the substrate and the second light emitter.

6. The light emitting apparatus according to claim 1, further comprising a metal layer that is supported by the support member and connects the first mirror and the second mirror to each other, and
thermal conductivity of the metal layer is higher than thermal conductivity of the support member.

7. A projector comprising the light emitting apparatus according to claim 1.

* * * * *